(12) United States Patent
Cui et al.

(10) Patent No.: US 8,896,077 B2
(45) Date of Patent: Nov. 25, 2014

(54) OPTOELECTRONIC SEMICONDUCTOR DEVICE AND METHOD OF FABRICATION

(75) Inventors: Yi Cui, Sunnyvale, CA (US); Jia Zhu, Stanford, CA (US); Ching-Mei Hsu, Stanford, CA (US); Shanhui Fan, Stanford, CA (US); Zongfu Yu, Stanford, CA (US)

(73) Assignee: The Board of Trustees of the Leland Stanford Junior University, Palo Alto, CA (US)

(*) Notice: Subject to any disclaimer, the term of this patent is extended or adjusted under 35 U.S.C. 154(b) by 655 days.

(21) Appl. No.: 12/909,064

(22) Filed: Oct. 21, 2010

(65) Prior Publication Data

US 2011/0095389 A1    Apr. 28, 2011

Related U.S. Application Data

(60) Provisional application No. 61/254,513, filed on Oct. 23, 2009, provisional application No. 61/263,582, filed on Nov. 23, 2009.

(51) Int. Cl.
| | |
|---|---|
| *H01L 31/0232* | (2014.01) |
| *H01L 21/04* | (2006.01) |
| *H01L 31/0236* | (2006.01) |
| *H01L 31/0352* | (2006.01) |

(52) U.S. Cl.
CPC .......... *H01L 31/02363* (2013.01); *Y02E 10/50* (2013.01); *H01L 31/02366* (2013.01); *H01L 31/03529* (2013.01)
USPC ............. 257/432; 438/69; 136/256; 257/466; 257/459; 257/292; 257/98

(58) Field of Classification Search
CPC ................... H01L 31/02363; H01L 31/02366; H01L 31/03529; H01L 2251/105; H01L 51/447
USPC ........... 257/432, E25.009, E27.124, E27.125, 257/466, 292, 459, 98; 136/256
See application file for complete search history.

(56) References Cited

U.S. PATENT DOCUMENTS

| | | | | |
|---|---|---|---|---|
| 4,554,727 | A | * 11/1985 | Deckman et al. | 438/71 |
| 4,633,030 | A | * 12/1986 | Cook | 136/246 |
| 4,703,337 | A | * 10/1987 | Yamazaki | 257/436 |
| 5,094,697 | A | * 3/1992 | Takabayashi et al. | 136/249 |
| 5,101,260 | A | 3/1992 | Nath et al. | |
| 5,103,851 | A | * 4/1992 | Nishida et al. | 136/249 |

(Continued)

OTHER PUBLICATIONS

Nikmanesh, Seahvosh J., "U.S. Appl. No. 12/948,025 Office Action Dec. 23, 2011",, Publisher: USPTO, Published in: US.

(Continued)

*Primary Examiner* — Long K Tran
*Assistant Examiner* — Jordan Klein
(74) *Attorney, Agent, or Firm* — Kaplan Breyer Schwarz & Ottesen, LLP

(57) ABSTRACT

An optoelectronic device comprising an optically active layer that includes a plurality of domes is presented. The plurality of domes is arrayed in two dimensions having a periodicity in each dimension that is less than or comparable with the shortest wavelength in a spectral range of interest. By virtue of the plurality of domes, the optoelectronic device achieves high performance. A solar cell having high energy-conversion efficiency, improved absorption over the spectral range of interest, and an improved acceptance angle is presented as an exemplary device.

32 Claims, 9 Drawing Sheets

(56) References Cited

U.S. PATENT DOCUMENTS

| | | | |
|---|---|---|---|
| 5,221,365 A * | 6/1993 | Noguchi et al. | 136/258 |
| 5,248,621 A * | 9/1993 | Sano | 438/64 |
| 5,269,852 A * | 12/1993 | Nishida | 136/258 |
| 5,453,135 A | 9/1995 | Nakagawa et al. | |
| 5,810,945 A * | 9/1998 | Stutzmann et al. | 438/96 |
| 5,814,839 A * | 9/1998 | Hosoba | 257/96 |
| 5,986,204 A | 11/1999 | Iwasaki et al. | |
| 6,072,117 A * | 6/2000 | Matsuyama et al. | 136/256 |
| 6,075,652 A * | 6/2000 | Ono et al. | 359/642 |
| 6,106,689 A * | 8/2000 | Matsuyama | 205/333 |
| 6,207,890 B1 * | 3/2001 | Nakai et al. | 136/246 |
| 6,222,117 B1 * | 4/2001 | Shiozaki | 136/256 |
| 6,331,672 B1 | 12/2001 | Matsuda et al. | |
| 6,653,552 B2 * | 11/2003 | Sugawara et al. | 136/250 |
| 6,806,141 B2 | 10/2004 | Kamins | |
| 7,106,938 B2 | 9/2006 | Baek et al. | |
| 7,301,215 B2 * | 11/2007 | Kariya | 257/458 |
| 7,812,355 B2 * | 10/2010 | Shiroguchi et al. | 257/79 |
| 7,923,626 B2 * | 4/2011 | Blieske et al. | 136/256 |
| 7,968,361 B2 * | 6/2011 | Osawa et al. | 438/47 |
| 8,035,113 B2 * | 10/2011 | Moustakas et al. | 257/79 |
| 8,133,768 B2 * | 3/2012 | Ray et al. | 438/141 |
| 8,183,587 B2 | 5/2012 | Samuelson et al. | |
| 8,258,050 B2 * | 9/2012 | Cho et al. | 438/487 |
| 8,323,732 B2 * | 12/2012 | Ajayaghosh et al. | 427/240 |
| 2003/0138608 A1 | 7/2003 | Landry-Coltrain et al. | |
| 2005/0174642 A1 * | 8/2005 | Tokunaga et al. | 359/495 |
| 2005/0189012 A1 * | 9/2005 | Kondo et al. | 136/256 |
| 2007/0120141 A1 | 5/2007 | Moustakas et al. | |
| 2007/0243669 A1 * | 10/2007 | Suzuki et al. | 438/142 |
| 2008/0223436 A1 | 9/2008 | den Boer et al. | |
| 2009/0107548 A1 | 4/2009 | Guerra | |
| 2009/0126789 A1 | 5/2009 | Li et al. | |
| 2009/0135491 A1 | 5/2009 | Endoh et al. | |
| 2009/0223561 A1 | 9/2009 | Kim et al. | |
| 2009/0320910 A1 | 12/2009 | Matsui et al. | |
| 2009/0325365 A1 | 12/2009 | Park et al. | |
| 2010/0065863 A1 * | 3/2010 | Ray et al. | 257/88 |
| 2010/0089443 A1 * | 4/2010 | Bloomstein et al. | 136/255 |
| 2010/0090341 A1 | 4/2010 | Wan et al. | |
| 2010/0243040 A1 | 9/2010 | Kim | |
| 2010/0269897 A1 | 10/2010 | Sakai et al. | |
| 2010/0282308 A1 | 11/2010 | Okamoto | |
| 2011/0129956 A1 | 6/2011 | Polito et al. | |
| 2011/0162710 A1 * | 7/2011 | Watai et al. | 136/256 |
| 2011/0180127 A1 | 7/2011 | Wan et al. | |
| 2011/0180141 A1 | 7/2011 | Nishida et al. | |
| 2012/0132275 A1 | 5/2012 | Nishida et al. | |

OTHER PUBLICATIONS

Atwater et al., "Plasmonics for improved photovoltaic devices", "Nature Materials www.nature.com/naturematerials", Mar. 2010, pp. 205-213, vol. 9, Publisher: Macmillan Publishers Limited.

Rosello Garcia, M., "PCT Application No. PCT/US2010/053576 Written Opinion Dec. 27, 2011",, Publisher: PCT, Published in: PCT.

Deckman et al., "Applications of surface textures produced with natural lithography", "Journal of Vacuum Science & Technology B", Oct.-Dec. 1983, pp. 1109-1112, vol. 1, No. 4, Publisher: American Vacuum Society, Published in: US.

Zhu et al., "Nanodome Solar Cells with Efficient Light Management and Self-Cleaning", "NanoLetters 2010 XP-002632310", 2010, pp. 1979-1984, Publisher: American Chemical Society, Published in: US.

Zhu et al., "Nanostructured photon management for high performance solar cells", "Materials Science and Engineering R 70 XP-027537230", 2010, pp. 330-340, Publisher: Elsevier B.V.

Law et al., "Nanowire dye-sensitized solar cells", "nature materials—Letters www.nature.com/naturematerials", Jun. 2005, vol. 4, Publisher: Nature Publishing Group, Published in: US.

Hsu et al., "Wafer-scale silicon nanopillars and nanocones by Langmuir-Blodgett assembly and etching", "Applied Physics Letters XP-012111721", 2008, pp. 133109-1-133109-3, vol. 93, No. 13, Publisher: American Institute of Physics, Published in: US.

Rosello Garcia, M., "PCT Application No. PCT/US2010/053576 International Search Report May 24, 2011",, Publisher: PCT, Published in: PCT.

Alexander G. Ghyka, "Related U.S. Appl. No. 13/078,782 Office Action", Feb. 15, 2013, Publisher: USPTO.

Ghyka, Alexander G., "Related U.S. Appl. No. 13/078,782 Office Action", Aug. 12, 2013, Publisher: USPTO, Published in: US.

Jordan Klein, "Related U.S. Appl. No. 13/305,731", "Non-Final Office Action", Feb. 7, 2014, Publisher: USPTO.

* cited by examiner

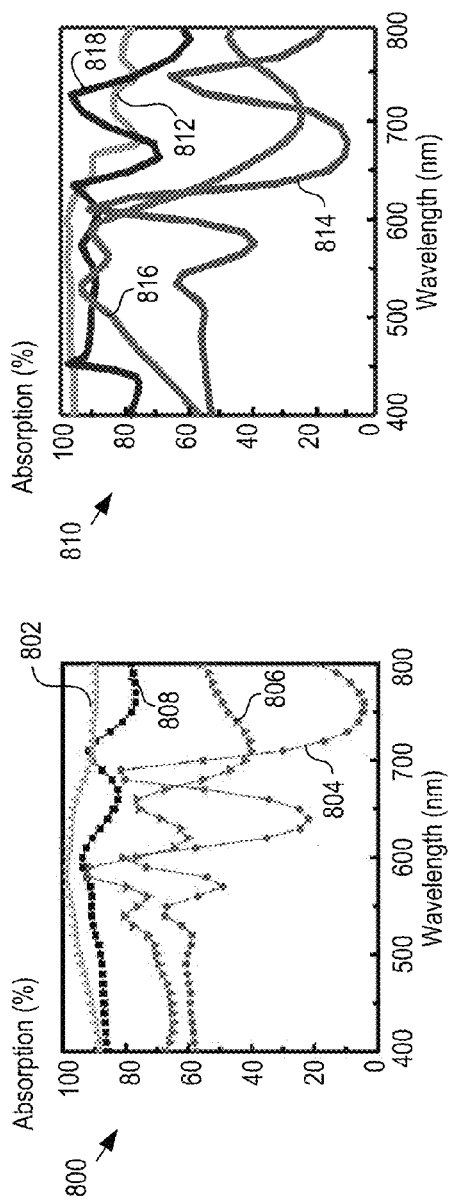
FIG. 8B
FIG. 8A
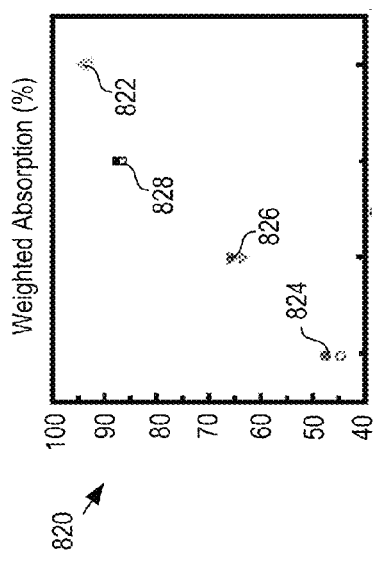
FIG. 8C

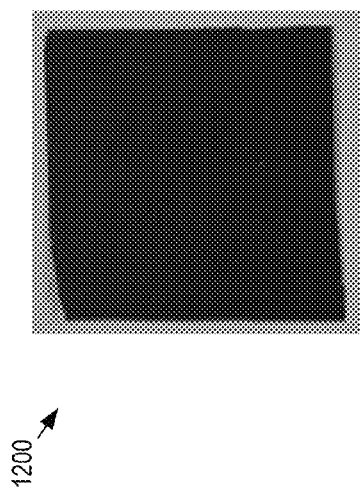
FIG. 12B
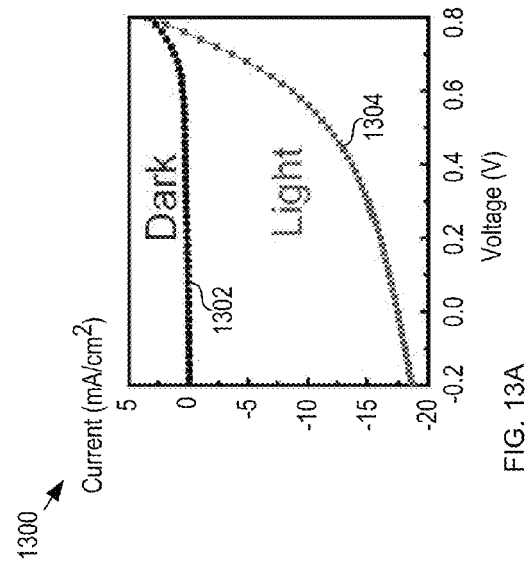
FIG. 13B
FIG. 12A
FIG. 13A

OPTOELECTRONIC SEMICONDUCTOR DEVICE AND METHOD OF FABRICATION

CROSS-REFERENCE TO RELATED APPLICATION

This application claims the benefit of:
(i) U.S. provisional application Ser. No. 61/254,513, filed Oct. 23, 2009, entitled "Optoelectronic Semiconductor Device and Method of Fabrication"; and
(ii) U.S. provisional application Ser. No. 61/263,582, filed Nov. 23, 2009, entitled "Substrate Comprising a Nanometer-scale Projection Array";
each of which is incorporated herein by reference.

STATEMENT REGARDING FEDERALLY-SPONSORED RESEARCH

This invention was made with Government support under contracts DE-FG02-07ER46426 and DE-FG36-08GO18004 awarded by the Department of Energy. The Government has certain rights in this invention.

FIELD OF THE INVENTION

The present invention relates to semiconductor devices in general, and, more particularly, to optoelectronic semiconductor devices.

BACKGROUND OF THE INVENTION

Optoelectronic semiconductor devices, such as solar cells, lasers, photodetectors, optical modulators, light emitting diodes, and the like, represent an important class of semiconductor devices. These optoelectronic semiconductor devices are enabling devices for applications across a broad range of areas, including medicine, optical telecommunications, military, analytical, astronomy, and energy conversion, to name just a few.

Operating efficiency is a key parameter for the suitability of a device in many applications. Operating efficiency is typically dictated by at least one of two factors: (1) material quality and layer structure of the semiconductors used to form the device and (2) the efficiency with which light can be coupled into or out of the device.

Efforts to improve material quality have resulted in remarkable advances in device performance over the past decade due to advances in deposition methods, equipment, and source materials. Further improvement in material quality, however, is becoming increasingly difficult to achieve.

Several advances in the layer structure of optoelectronic semiconductor devices have also been made over the last decade or so. Multiple quantum-wells, buried oxide layers, exotic guard ring structures, and the like have been developed to try to improve device efficiency, among other reasons. Such exotic layer structures can lead to dramatically increased cost and more complicated fabrication, which can make such devices significantly less attractive for many applications.

The ability to couple light into or out of a device often depends upon the characteristics of an anti-reflection layer (a.k.a., AR coating) that is disposed on the surface of the device. A large mismatch normally exists between the refractive indices of the semiconductor and air, which results in high-reflectivity at the interface of the two materials. An anti-reflection layer is used to "soften" the effect of this the refractive index mismatch by interposing a material having a refractive index that is between those of the semiconductor and air.

A conventional anti-reflection layer that is designed for operation at a specific wavelength has a thickness equal to one-quarter of that wavelength. For devices that operate over a narrow band of wavelengths, such as a laser, a conventional anti-reflection layer can be highly effective. Unfortunately, many optical semiconductor devices, such as solar cells, photodetectors, light-emitting diodes, etc., operate over a range of wavelengths (i.e., a spectral range of interest) that can be as large as hundreds of nanometers (nm). Typically, an anti-reflection layer for such devices is tuned to the center wavelength (as measured in the material comprising the layer) of the required wavelength range. The anti-reflection layer is well-suited for light at this center wavelength; however, its effectiveness rapidly decreases for wavelengths further away from the center wavelength. In order to improve the broadband performance of an anti-reflection layer in such applications, complicated multi-layer coatings and graded-index coatings are often used; however, such coatings can dramatically increase the cost and complexity of an optoelectronic semiconductor device.

SUMMARY OF THE INVENTION

The present invention enables optoelectronic semiconductor devices that have high operating efficiency compared to devices known in the prior art. Embodiments of the present invention are particularly well-suited for solar cells, semiconductor lasers, light-emitting diodes, optical modulators, and photodetectors.

Embodiments of the present invention comprise an optically active layer that comprises a plurality of nanodomes that are arranged in two-dimensions. In some embodiments, the arrangement of nanodomes is aperiodic. In some embodiments, the plurality of nanodomes has a periodicity in at least one of the two dimensions. In some embodiments, this periodicity is greater than the bandgap wavelength of the optically active layer. In some embodiments, this periodicity is less than or equal to twice the bandgap wavelength of the optically active layer. An optoelectronic semiconductor device that comprises such a plurality of nanodomes is referred to herein as a nanodome device.

Some embodiments of the present invention further comprise an anti-reflection layer disposed on the optically active layer, wherein the anti-reflection layer is substantially conformal with the optically active layer. As a result, the anti-reflection layer also comprise a plurality of nanodomes whose layout matches that of the nanodomes of the optically active layer.

The illustrative embodiment of the present invention is a solar cell having an optically active layer that comprises a plurality of nanodomes. The plurality of nanodomes is arrayed in two-dimensions with a periodicity in each dimension that less than or comparable to the longest wavelength in a spectral range of interest. A solar cell comprising such a plurality of nanodomes is herein referred to as a nanodome solar cell.

In some embodiments, the nanodome structure is formed by conformal deposition of the optically active layer on a structure that comprises a plurality of projections from the surface of an underlying substrate. The conformal deposition of the optically active layer material on these projections results in the formation of a dome-shaped region disposed on each projection.

In some embodiments, the nanodome structure of nanodome solar cells reduces the reflectivity of the device over the spectral range of interest, which results in improved light absorption in the optically active layer of the solar cell structure. In some embodiments, an anti-reflection layer is disposed on the optically active layer, which further reduces the reflectivity of the device over the spectral range of interest.

An embodiment of the present invention comprises a nanodome solar cell comprising an optically active layer that includes a p-i-n layer formed of three layers of hydrogenated amorphous silicon. The combined thickness of the p-i-n layer structure is approximately 280 nm-thick; however, the optically active layer absorbs up to 94% of incident light having wavelengths within the range of 400 nm to 800 nm. This represents a significant increase over the absorption of prior-art planar solar cells (~65%).

In some embodiments, the nanodome structure enables an optoelectronic semiconductor device to have a larger optical coupling range of incident angles than devices in the prior art. The increased optical coupling range enables embodiments of the present invention to more efficiently couple, into or out of the device, light that propagates over a range of incident angles.

In some embodiments, the nanodome structure enables a self-cleaning capability in nanodome devices whose top surface is modified with hydrophobicity-inducing molecules.

In some embodiments, the nanodome structure enables an improved thermal mechanical stability.

An embodiment of the present invention comprises an article comprising a first composite layer comprising a plurality of domes, wherein the first composite layer is an optically active layer that is characterized by a band gap wavelength, $\lambda_{bg}$.

BRIEF DESCRIPTION OF THE DRAWINGS

FIG. 8A depicts a plot comparing absorption versus wavelength for different types of solar cell structures.

FIG. 8B depicts simulations of absorption versus wavelength for different types of solar cell structures.

FIG. 8C depicts the weighted absorption for different types of solar cell structures.

FIGS. 12A and 12B depict photographs of nanodome solar cells and conventional planar solar cells, respectively.

FIGS. 13A and 13B depict plots of the electrical response of a nanodome solar cell and a planar solar cell, respectively.

DETAILED DESCRIPTION

The following terms are defined for use in this Specification, including the appended claims:

Disposed on is defined as meaning "exists on" an underlying material or layer. This layer may comprise intermediate layers. For example, if a material is described to be "disposed on a substrate," this can mean that either (1) the material is in intimate contact with the substrate; or (2) the material is in contact with one or more interposing layers that reside on the substrate.

Optically active layer is defined as one or more layers that collectively define an optical structure, such as a solar cell, laser, light emitting diode, photodetector, and the like.

Figure 1:
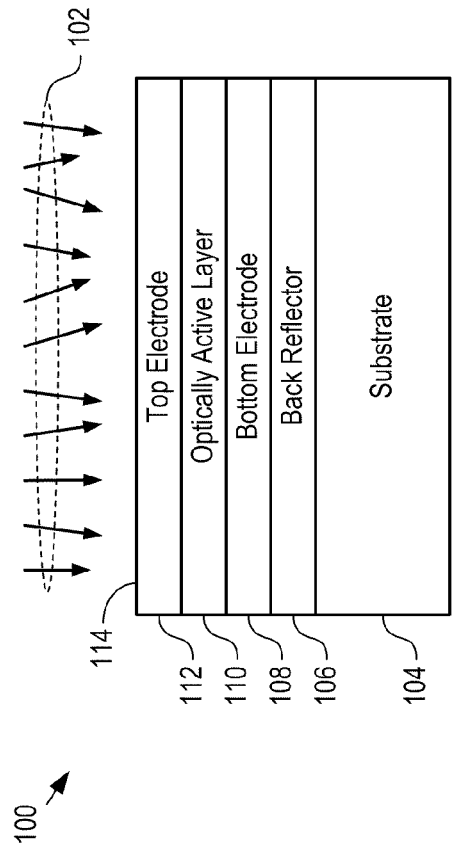
FIG. 1 depicts a schematic drawing of a solar cell in accordance with an illustrative embodiment of the present invention.

FIG. 1 depicts a schematic drawing of a solar cell in accordance with an illustrative embodiment of the present invention. Solar cell 100 comprises substrate 104, back reflector 106, bottom electrode 108, optically active layer 110, and top electrode 112. Solar cell 100 is suitable for providing electrical energy when illuminated by sunlight 102.

Sunlight 102 spans a very broad spectral range from approximately 300 nm to approximately 2000 nm. For practical purposes, however, the spectral range of interest for solar cell technology is typically approximately 300 nm to approximately 1200 nm. It should be noted that a significant portion of this spectral range is above the bandgap wavelength of a typical solar cell structure. For example, for an amorphous silicon-based solar cell, which has a bandgap wavelength of approximately 700 nm, the spectral range of interest includes wavelengths from approximately 300 nm to approximately 800 nm. Further, in a practical environment, sunlight 102 arrives at solar cell 100 over a broad range of incident angles. As a result, it is advantageous for solar cell 100 to be responsive to light that arrives with angles of incidence within the range of normal to as large as 60° from normal.

Solar cell 100 is characterized by a topography characterized by an array of "dome-shaped" regions. These dome-shaped regions are arrayed with a periodicity that is less than or comparable to the wavelengths of light within the spectral range of interest. In some embodiments, the dome-shaped regions have size and/or periodicity larger than the wavelengths of light within the spectral range of interest. Further, in some embodiments, the dome-shaped regions are arranged in an aperiodic manner (e.g., random or semi-random) in at least one dimension. Since for most applications, the size and periodicity of the sub-wavelength dome-shaped regions is in the nanometer range, optical devices characterized by a top surface that comprises dome-shaped regions are referred to herein as "nanodome" devices (e.g., a "nanodome solar cell," etc.). For the purpose of this Specification, including the appended claims, a "dome" is defined as a shape that is generally hemispherical or semispherical. The topography of solar cell 100 affords embodiments of the present invention with several advantages that are described in more detail below, and with respect to FIG. 3E. These advantages include:

i. improved light absorption over the wavelength band of interest; or ii. improved light coupling into optically active layer 110; or iii. reduced reflectivity over the wavelength band of interest; or iv. any combination of i, ii, and iii.

One skilled in the art will recognize that the term "dome" encompasses a broad range of shapes wherein a shape's top dimension is smaller than its bottom dimension. Further, one skilled in the art will recognize that variations of a dome-shape are within the scope of this Specification. As a result, the definitions of "nanodome" and "dome" include structures such as non-smooth domes, distorted domes, and the like.

It should be noted that although the illustrative embodiment comprises an optical device that is a solar cell, the present invention is applicable to other optical devices, such as light-emitting diodes, lasers, optical modulators, thermionics, thermal photovoltaic and photodetectors. It should be further noted that the wavelength range of interest is dependent upon the application for which an embodiment of the present invention is intended. Device-specific characteristics, such as wavelength sensitivity, nanodome periodicity, material composition, etc., are based on the intended wavelength range of operation. As a result, such characteristics as provided for solar cell 100 are based on solar cell applications and one skilled in the art will recognize that these parameters can be different for embodiments of the present invention intended for different applications.

Figure 2:
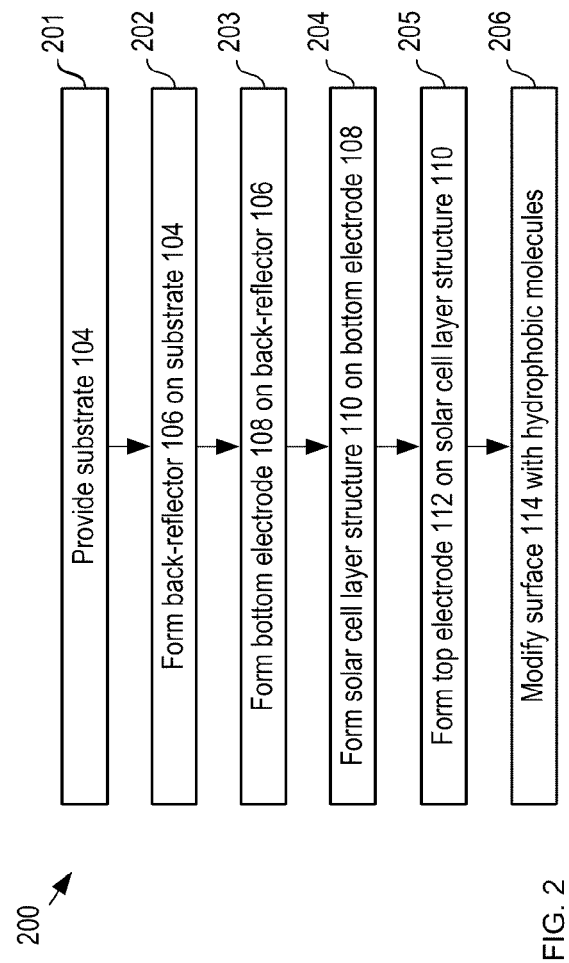
FIG. 2 depicts operations of a method for forming a solar cell in accordance with the illustrative embodiment of the present invention.

FIG. 2 depicts operations of a method for forming a solar cell in accordance with the illustrative embodiment of the present invention. Method 200 begins with operation 201, wherein substrate 104 is provided. Method 200 is described herein with continuing reference to FIG. 1 as well as reference to FIGS. 3A-E.

Figure 3D:
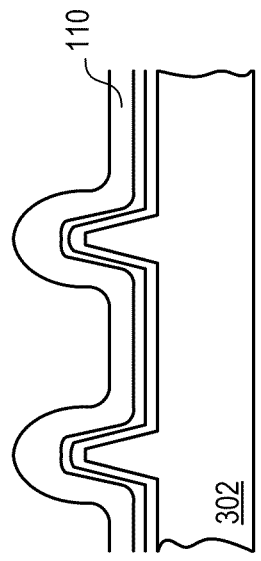
FIGS. 3A-E depicts cross-sectional views of a portion of a nanodome solar cell at different stages of fabrication in accordance with the illustrate embodiment of the present invention.
Figure 3E:
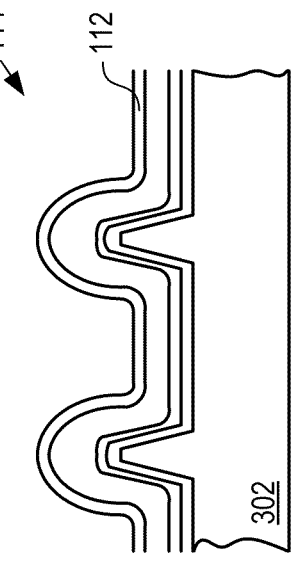
Figure 3A:
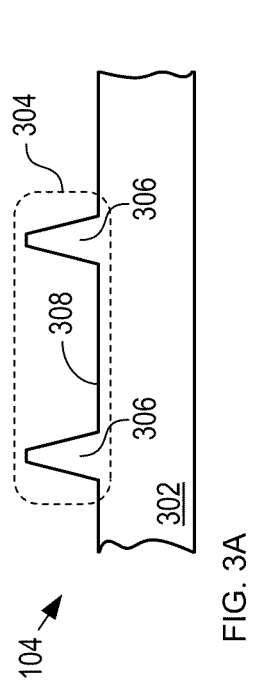

FIG. 3A depicts a cross-sectional view of a portion of a substrate in accordance with the illustrate embodiment of the present invention. Substrate 104 comprises bulk substrate 302 and projection array 304. Projection array 304 comprises a plurality of projections 306 that depend from surface 308.

Figure 4:
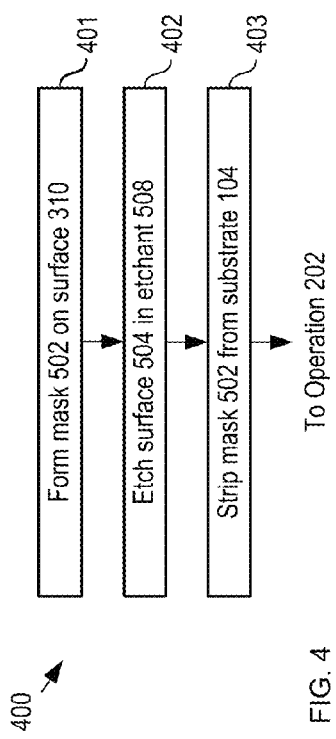
FIG. 4 depicts sub-operations suitable providing substrate 104 in accordance with the illustrative embodiment.

FIG. 4 depicts sub-operations suitable providing substrate 104 in accordance with the illustrative embodiment. Methods suitable for forming substrate 104 are described in more detail in "Wafer-scale silicon nanopillars and nanocones by Langmuir-Blodgett assembly and etching," *Applied Physics Letters*, (93), 133109 (2008), which is incorporated by reference herein. Sub-method 400 begins with sub-operation 401, wherein mask 502 is formed on surface 504 of bulk substrate 302.

Bulk substrate 302 is a conventional bulk silicon substrate. In some embodiments, bulk substrate 302 is other than a bulk silicon substrate. Substrates in accordance with embodiments of the present invention include, without limitation, glass substrates, compound semiconductor substrates, semiconductor-on-insulator substrates, and the like.

Figure 5A:
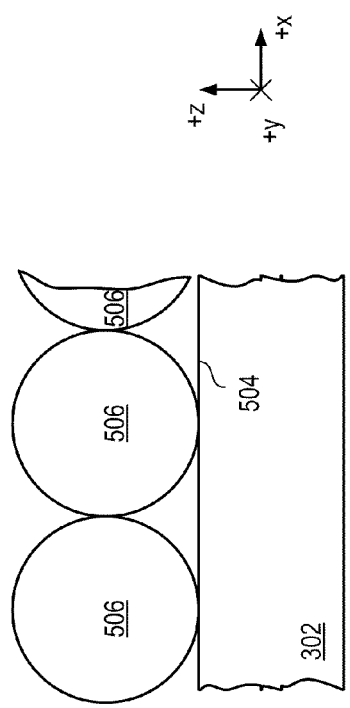
FIGS. 5A-C depict cross-sectional views of a portion of a nanocone substrate at different stages of its fabrication in accordance with the illustrative embodiment of the present invention.

FIG. 5A depicts a cross-sectional view of a portion of substrate 104 after formation of mask 502 on surface 504. Mask 502 comprises a monolayer of particles 506, which are dispersed on surface 504. Particles 506 are of silicon dioxide spheres having a substantially uniform diameter of approximately 450 nm. In some embodiments, particles 506 are particles of a material other than silicon dioxide. Materials suitable for use in particles 506 include, without limitation, metals, dielectrics, ceramics, semiconductors, polymers, composites, and the like. Particles 506 are arranged on surface 504 in a close-packed arrangement. One skilled in the art will recognize that the periodicity of projections 306 is based on the size, shape, and configuration of particles 506, each of which is controllable. Although in the illustrative embodiment mask 502 comprises 450 nm-diameter silicon dioxide spheres that are arranged on surface 504 in a close-packed configuration, it will be clear to one skilled in the art, after reading this specification, how to specify, make, and use, alternative embodiments of the present invention wherein mask 502 comprises particles 506 that have any suitable shape or size and are arranged in other than a close-packed arrangement. In some alternative embodiments, mask 502 is formed using conventional mask layer deposition and patterning techniques, such as photolithography and etching.

Once particles 506 are arranged on surface 504, an optional reactive ion etch (RIE) can be used to tune the size of the particles to any desired smaller diameter. In order to reduce the diameter of particles 504, they are subjected to a conventional silicon dioxide-selective RIE process. One skilled in the art will recognize, after reading this specification, how to etch the material of particles 506 over the material of substrate 104 with a desired etch selectivity.

At sub-operation 402, projections 306 are formed by etching surface 504 through mask 502 using conventional RIE.

Figure 5B:
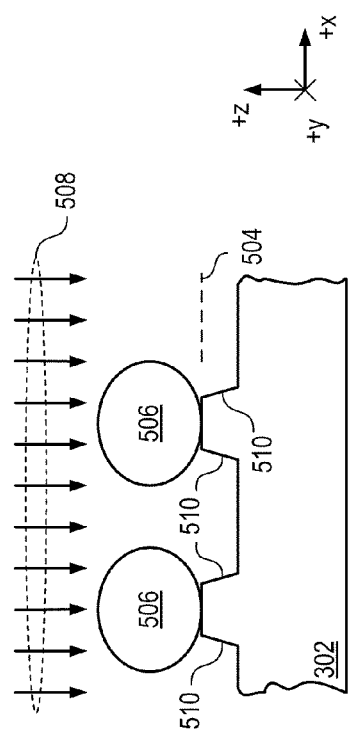

FIG. 5B depicts a cross-sectional view of a portion of substrate 104 during the formation of projections 306. Etchant 508 is a gas, or combination of gases, that etches the material of particles 304 and the material of substrate 302. Depending upon the desired shape of projections 306, the relative etch rates for the materials of particles 304 and substrate 302 can typically be varied over a suitable range. During sub-operation 402, particles 506 are undercut by etchant 508, which results in inwardly sloping sidewalls 510. In the illustrative embodiment, the RIE of bulk substrate 302 continues until the formation of substantially cone-shaped projections 306.

In some embodiments, projections 306 are formed in an isotropic RIE process that etches substrate 302 selectively over particles 304. The isotropic nature of the RIE process results in severe undercutting of each of particles 306, thereby forming projections 306 that have columnar or conical shape. The resultant shape of projections 306 is based on the duration of the RIE process and the size of particles 304.

In some embodiments, surface 504 is etched in a non-reactive ion etch process, such as wet chemical etching. It will be clear to one skilled in the art, after reading this specification, how to etch bulk substrate 302 to form projections 306. Further, it will also be clear how to form projections 306 that have a shape other than a circular cone, such as a cylinder, column, or other suitable shape.

At sub-operation 403, residual mask material is removed by an etch that selectively etches the material of mask 502 without significantly attacking the material of substrate 104.

Figure 5C:
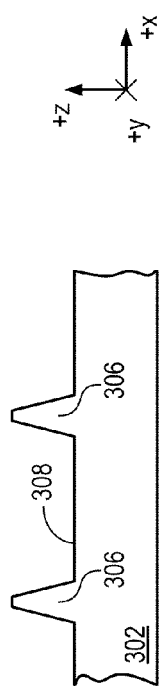

FIG. 5C depicts a cross-sectional view of a portion of fully formed substrate 104 after removal of mask 502. By virtue of the characteristics of mask 502 and the RIE process used to etch surface 504, each of projections 306 are substantially circular cones having a base diameter of approximately 100 nm and a height of approximately 150 nm. A substrate comprising a plurality of projections such as projections 306 is referred to herein as a "nanocone substrate." Further, projections 306 have a periodicity in each of the x- and y-dimensions of approximately 450 nm. In some embodiments, projections 306 have a periodicity in the x-dimension that is different from their periodicity in the y-dimension.

The periodicity of the projections in each dimension is based on the wavelength of operation for the optoelectronic semiconductor device that comprises the substrate. In some embodiments, it is preferable for the projections to have a periodicity, in at least one dimension, that is less than about twice the longest wavelength of light for which the device is operable. Such periodicity results in an interaction regime between the light and the corrugated surface of the device (that results from the presence of the projections) that is advantageous. Typically, the longest wavelength of light for which the device is operable is based on the bandgap wavelength, $\lambda_{bg}$, of the device's optically active layer; therefore, the projections are formed with a periodicity that is less than about twice this bandgap wavelength (i.e., less than or equal to $2\lambda_{bg}$).

It should be noted that the preferred periodicity of projections 306 is based on the application for which a device is intended. As a result, in some embodiments, the periodicity of the projections is less than or equal to $\lambda_{bg}$. In some embodiments, the periodicity of the projections is less than or equal to $3\lambda_{bg}/4$. In some embodiments, the periodicity of the projections is less than or equal to $\lambda_{bg}/2$.

Figure 6:
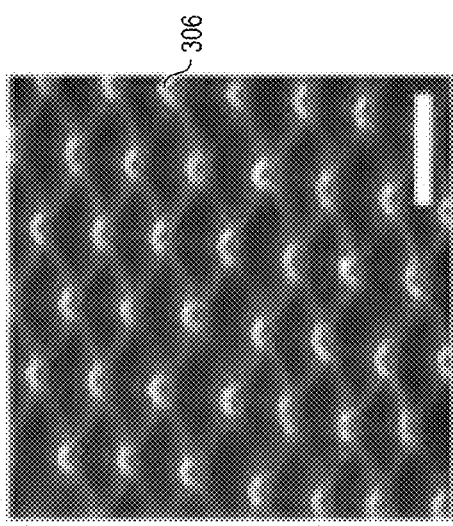
FIG. 6 depicts a scanning electron microscope image of a completed substrate in accordance with the illustrative embodiment of the present invention.

FIG. 6 depicts a scanning electron microscope image of a completed substrate in accordance with the illustrative embodiment of the present invention.

It should be noted that the base diameters, heights, and spacing of projections 306 can be controlled through control of mask parameters, etchant selection, and RIE process parameters. For example, base diameters and periodicity of projections 306 can be readily controlled within the range of approximately 100 nm to approximately 1000 nm simply through judicious choice of RIE etch parameters. This range of base diameters and projection periodicities is particularly attractive for solar cell applications by virtue of its relationship to the wavelength of sunlight. In some applications, these dimensions are controlled over a different size range that is based on the wavelength of light associated with the application.

At operation 202, back-reflector 106 is formed on substrate 104. Back-reflector 106 is deposited on substrate 104 using conventional metal deposition techniques.

Figure 3B:
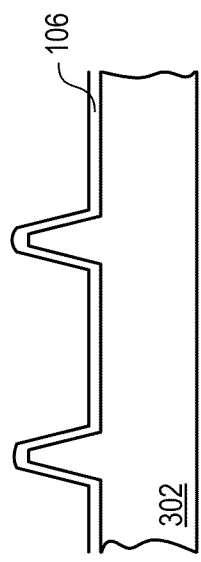

FIG. 3B depicts a cross-sectional view of a portion of solar cell 100, after deposition of back-reflector 106. Back-reflector 106 is a layer of silver having a thickness of approximately 100 nm. Back-reflector 106 is substantially conformal with substrate 104, although the addition of back-reflector material forms a slightly rounded region located at the sharp peaks of projections 306. Back-reflector 106 is deposited on substrate 104 using conventional metal deposition techniques. Silver provides high reflectivity for light having a wavelength within the range of interest for solar cell 100. In some embodiments, back-reflector 106 comprises a reflective layer other than silver. It will be clear to one skilled in the art, after reading this specification, how to specify, make, and use back-reflector 106.

In some embodiments, back-reflector 106 comprises a nanoscale surface modulation that induces Plasmon-enhanced light absorption.

At operation 203, bottom electrode 108 is formed on back-reflector 106. Bottom electrode 108 is deposited on back-reflector 106 using conventional deposition techniques.

Figure 3C:
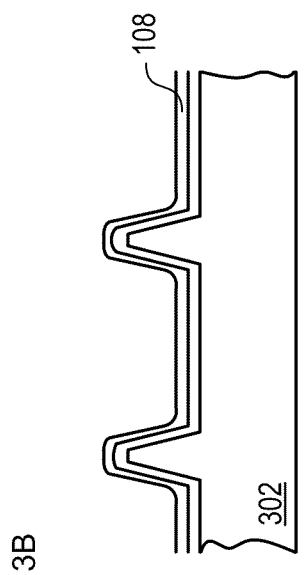

FIG. 3C depicts a cross-sectional view of a portion of solar cell 100, after deposition of bottom electrode 108. Bottom electrode 108 is a layer of transparent conductive oxide having a thickness of approximately 80 nm. Bottom electrode 108 is substantially conformal with back-reflector 106, although the addition of bottom electrode material further rounds the regions disposed on top of projections 306. Materials suitable for use in bottom electrode 108 include, without limitation, indium-tin oxide, zinc-oxide, aluminum-zinc-oxide, and the like. It will be clear to one skilled in the art, after reading this specification, how to specify, make, and use bottom electrode 108.

It should be noted that many prior-art solar cells comprise silver nanoparticle arrays on the surface of top electrode to enhance absorption in the region close to bandgap edge. However, since these nanoparticles are put on the top of the surface, part of the short wavelength light around resonant frequency is wasted by either scattering or absorption.

At operation 204, optically active layer 110 is formed on bottom electrode 108. Optically active layer 110 is a composite layer of a plurality of semiconductor layers that collectively define a p-i-n solar cell. All of the layers that collectively define optically active layer 110 are conformally deposited on bottom electrode 108 using conventional deposition techniques.

FIG. 3D depicts a cross-sectional view of a portion of solar cell 100, after deposition of optically active layer 110. Optically active layer 110 comprises a p-i-n structure of layers of hydrogenated amorphous silicon (a-Si:H).

Hydrogenated amorphous silicon is an attractive material for the layers of optically active layer 110 due, in part, to its abundance, non-toxic nature, and the fact that it can be made using relatively low-temperature processes. In addition, a-Si:H absorbs light within the 400 nm to 800 nm wavelength range very efficiently as compared to most other material systems. For example, a-Si:H has an absorption depth of only one micron, which is several hundred times shorter than that of crystalline silicon. Efficient light management is still critical for performance improvement, however, since the carrier diffusion length (<300 nm) in a-Si:H is still much shorter than the absorption length. As a result, generated charge carriers can recombine within the semiconductor layers before they have a chance to contribute to the generated voltage between the solar cell electrodes.

Prior-art a-Si:H solar cells typically comprise an optically active layer having a thickness on the order of 1 micron so as to substantially maximize the absorption of incident light. Although such thick a-Si:H layers enable good absorption, thinner layers are preferable in order to avoid a 10-30% efficiency degradation under light soaking, known as the Stabler-Wronski effect. Unfortunately, it is difficult to efficiently absorb and trap incident light in the conventional planar layer structure of prior-art solar cells. The present invention, however, enables a marked improvement in light absorption and trapping in optically active layer 110; therefore, the aggregate thickness of optically active layer 110 can be quite thin yet efficiently absorb incident light.

Optically active layer 110 comprises a layer of p-doped hydrogenated amorphous silicon having a thickness of approximately 10 nm that is disposed on a layer of substantially undoped (i.e., intrinsic) hydrogenated amorphous silicon having a thickness of approximately 250 nm that is disposed on a layer of n-doped hydrogenated amorphous silicon having a thickness of approximately 20 nm. It is an aspect of the present invention that the conformal deposition on projections 306 and the intervening layers creates a plurality of domes in optically active layer 110. These domes are disposed on each of projections 306 in projection array 304. As a result, the domes have the same periodicity as projections 306 (i.e., approximately 450 nm in each of the x- and y-dimensions).

The thickness of optically active layer 110 is selected to enable good absorption of light over the wavelength range of light over which device operation is intended. In some embodiments, this thickness of optically active layer 110 is within the range of:

approximately 50 nm to approximately 5000 nm; or
approximately 2000 nm to approximately 5000 nm; or
approximately 1000 nm to approximately 2000 nm; or
approximately 500 nm to approximately 1000 nm; or
approximately 200 nm to approximately 500 nm; or
approximately 50 nm to approximately 200 nm.

In the illustrative embodiment, optically active layer 110 is characterized by an electrical band gap of approximately 1.75 eV, which corresponds to a bandgap wavelength of approximately 710 nm. The correspondence of electrical band gap and band gap wavelength is defined by the relation $E_g = hc/\lambda_{bg}$, where $E_g$ is the energy band gap, h is Planck's constant, c is the speed of light in vacuum, and $\lambda_{bg}$ is the bandgap wavelength. As one skilled in the art will recognize, a conventional solar cell having a bandgap wavelength of 710 nm will have good absorptivity for light having wavelengths less than approximately 700 nm. Absorptivity for light having wavelengths longer than 700 nm falls off rapidly for such a conventional solar cell, however.

In some embodiments, optically active layer 110 comprises one or more layers other than hydrogenated amorphous silicon, but which are suitable for forming a solar cell layer structure. Such materials include, without limitation, crystalline silicon, polycrystalline silicon, nanocrystalline silicon, cadmium telluride, copper-indium-gallium-selenide, copper-indium-gallium-diselenide, copper-indium-disulfide, III-V compound semiconductors (e.g., InP, GaN, InN, InGaN, InGaAs, InGaAsP, InGaP, InGaAlAs, etc.), II-VI compound semiconductors (e.g., HgCdTe, ZnSe, CdS, CdSe, CdZnTe, HgCdTe, $Cu_2ZnSnS_4$, etc.), ternary compound semiconductors, quaternary compound semiconductors, organic semiconductors, and the like.

Although the illustrative embodiment is a solar cell, it will be clear to one skilled in the art, after reading this specification, how to specify, make, and use alternative embodiments of the present invention that are optoelectronic semiconductor devices other than solar cells. For example, the present invention is applicable to, without limitation, light-emitting diodes, lasers, thermionics, modulators, and photodetectors.

Further, although the illustrative embodiment of the present invention is operable over a spectral range that extends from approximately 400 nm to approximately 800 nm, it will also be clear to one skilled in the art, after reading this specification, how to make and use alternative embodiments of the present invention that are operable over any portion of the range of wavelengths from approximately 300 nm to approximately 1600 nm. For example, the present invention is suitable for use with any semiconductor laser from short-wavelength lasers (e.g., a diode-pumped semiconductor laser having a wavelength of approximately 532 nm) to long-wavelength lasers (e.g., indium-gallium-arsenide-phosphide lasers having wavelengths greater than 1300 nm).

It should be noted that although optically active layer 110 comprises three layers, each of which are semiconductor layers, one skilled in the art will recognize that optically active layers in accordance with the present invention can comprise any number of layers that comprise any combination of suitable materials including, without limitation, semiconductors, transparent conductors, metals, transparent electrically conductive layers, and dielectrics.

At operation 205, top electrode 112 is formed on optically active layer 110. Top electrode 112 is substantially conformal with optically active layer 110.

FIG. 3E depicts a cross-sectional view of a portion of solar cell 100, after deposition of top electrode 112. Top electrode 112 is analogous to bottom electrode 108 and has a thickness of approximately 80 nm. Electrodes 108 and 112 enable electrical connectivity to optically active layer 110.

Top electrode 112 also functions as an anti-reflection layer for optically active layer 110. In the illustrative embodiment, top electrode 112 comprises indium-tin-oxide (ITO), which has a refractive index suitable for an anti-reflection layer for optically active layer 110, which has a refractive index of approximately 4.23. It should be noted that an optically active layer comprising nanodomes is characterized by a reduced reflectivity as compared to a conventional planar optically active layer—even without the presence of an anti-reflection layer, such as top electrode 112. As a result, in some embodiments, top electrode 112 is not an anti-reflection layer. Further, in some embodiments, top electrode 112 is not included on optically active layer. It will clear to one skilled in the art, after reading this specification, how to specify, make, and use alternative embodiments of the present invention that comprise alternative layer structures, such as co-planar electrical contacts that are disposed beneath an optically active layer.

It is an aspect of the present invention that the corrugated shape of top electrode 112 enables it to act as a broad-band anti-reflection layer. As a result, the reflectivity of solar cell 100 is lower than that of a comparable conventional solar cell. One skilled in the art will recognize that a solar cell having lower reflectivity will typically have improved energy conversion performance.

For a conventional planar anti-reflection layer, the thickness of the layer is normally selected as equal to one-quarter of the center wavelength (as measured in the material comprising the layer) of the wavelength band of interest. This typically results in little reflection for light having this center wavelength, but rapidly increasing reflectivity as the wavelength of light moves away from the center wavelength. In some prior-art devices, more complicated anti-reflection layers have been used, such as multi-layer AR coatings, graded-index layers, and the like. While these more complicated anti-reflection layers can be effective in broadening their performance, they significantly increase the cost and complexity of the devices. In some cases, their use also leads to material and/or environmental incompatibility.

In embodiments of the present invention, however, the corrugated profile of top electrode 112 results in top electrode 112 having an "effective graded-index profile." For the purposes of this Specification, including the appended claims, a layer having an "effective graded-index profile" is defined as a layer whose actual refractive index is substantially uniform through its thickness; however, the layer behaves as a graded-index layer due to its shape. An effective graded-index profile enables top electrode 112 to exhibit good anti-reflection behavior over a broader wavelength range than a comparable conventional anti-reflection layer having a planar shape.

One skilled in the art will recognize that the present invention is suitable for use with more complicated optoelectronic semiconductor devices. For example, it will be clear to one skilled in the art, after reading this specification, that operations 203 through 205 can be repeated as many times as practical to form multiple optoelectronic device structures that are disposed vertically on the same substrate. Such vertically stacked structures include, without limitation, tandem solar cells, multi-junction solar cells, and the like.

In addition to the optical performance advantages described herein, the inclusion of dome-shaped regions affords embodiments of the present invention with improved thermo-mechanical stability. Dome-shaped regions enable thermal expansion of layers disposed on substrate 104 to occur in out-of-plane directions. In-plane stress due to differential thermal expansion of these layers and the substrate, therefore, is reduced. As a result, substrate curvature caused by this in-plane stress is also reduced.

Figure 7:
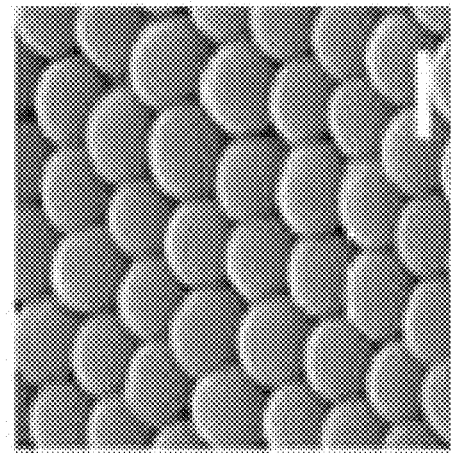
FIG. 7 depicts a scanning electron microscope image of a portion of the top surface of a completed solar cell in accordance with the illustrative embodiment of the present invention.

FIG. 7 depicts a scanning electron microscope image of a portion of the top surface of a completed solar cell in accordance with the illustrative embodiment of the present invention.

FIG. 8A depicts a plot comparing absorption versus wavelength for different types of solar cell structures. Plot 800 depicts the absorption characteristics versus wavelength for: a solar cell analogous to solar cell 100 having top electrode 112 (sample 802); a solar cell analogous to solar cell 100 without top electrode 112 (sample 804); a conventional planar solar cell having an anti-reflection layer disposed on its top surface (sample 806); and a conventional solar cell without an anti-reflection layer disposed on its top surface (sample 808).

FIG. 8B depicts simulations of absorption versus wavelength for different types of solar cell structures. Curves 812, 814, 816, and 818 correspond to the result of simulations of the layer structures of samples 802, 804, 806, and 808, respectively.

FIG. 8C depicts the weighted absorption for different types of solar cell structures. Data points 822, 824, 826, and 828 are weighted absorptions measurements for samples 802, 804, 806, and 808, respectively.

It can be inferred from plot 800 that embodiments of the present invention derive several advantages from their nanodome geometry, as compared to conventional planar solar cells. First, a nanodome solar cell has lower reflectivity over the entire spectral range of interest, as compared to conventional planar solar cells.

Second, nanodome solar cells have significantly higher absorption over the entire spectral range of interest, as compared to conventional planar solar cells.

Third, nanodome solar cells trap incident light more effectively than conventional planar solar cells.

Fourth, nanodome solar cells are responsive for light that is received over a larger range of incident angles than conventional planar solar cells.

Improved Anti-Reflection Performance

Plot 800 demonstrates that the inclusion of an anti-reflection layer improves the absorption of both nanodome solar cells and planar solar cells, as would be expected. It should be noted, however, that the improvement in absorption with the addition of an anti-reflection layer (i.e., top electrode 112) is less for the nanodome solar cell (from 87% to 94%) than for the planar solar cell (from 48% to 65%). It can be inferred from this data that a solar cell structure having nanodome geometry already has very good antireflection properties, as compared to the planar solar cell geometry, even without an anti-reflection layer.

Further, as discussed above and with respect to FIG. 3E, an anti-reflection layer disposed on a nanodome solar cell is characterized by an effective graded-index of refraction. As a result, the surface of a nanodome solar cell provides a better impedance match to the refractive index of air, which broadens the anti-reflection characteristic of top electrode 112 so that it is more effective over the entire spectral range of interest.

Still further, the corrugated surface of nanodome solar cells scatters that light that is reflected from surface 114 into a wide range of angles. Much of this reflected light is scattered such that it propagates along surface 114 (i.e., in-plane scattering), where it can then couple into neighboring dome regions. As a result, light scattering by the nanodome structures can improve overall coupling efficiency of solar cell 100.

Improved Broad-Band Absorption

As evident from plot 800, the absorption in sample 804 (i.e., a nanodome solar cell without an anti-reflection layer) is above 85%, while absorption in sample 808 (i.e., a planar solar cell without an anti-reflection layer) is below 60%. The addition of an anti-reflection layer improves absorption to above 88% and 65%, respectively (i.e., samples 802 and 808). One skilled in the art will recognize that in the short wavelength region (below 500 nm), substantially all light loss can be attributed to reflection from the solar cell surface since the absorption depth in this wavelength regime (~100 nm) is smaller than the thickness of optically active layer 110 (~280 nm).

Another aspect of the present invention that the nanodome-shape of optically active layer 110 and top electrode 112 improves light absorption in optically active layer 110, particularly at longer wavelengths within the wavelength range of interest. For wavelengths greater than the bandgap wavelength (~710 nm for the illustrative embodiment), in particular, the absorption coefficient in optically active layer 110 drops quickly. As a result, absorption length (i.e., the interaction length required to enable absorption) increases commensurately.

In a conventional planar solar cell structure, light is primarily absorbed only over a distance equal to the deposited thickness of its optically active layer. Since this thickness is much less than the absorption length of such light, little, if any, longer wavelength light is absorbed in a planar solar cell structure.

In contrast, the present invention enables greater light absorption due, in part, to the fact that the interaction length for substantially normal incidence light along the sides of the nanodome structures can be significantly greater than the thickness of optically active layer 110. The increased interaction length, therefore, can exceed the absorption depth for the longer wavelengths of light. As a result, embodiments of the present invention can absorb light over a broader spectral range than prior-art solar cells.

The data shown in plot 800 clearly indicates improved absorption of nanodome solar cells (with anti-reflection layers) for light having wavelengths greater than the bandgap wavelength of solar cell 100 (i.e., light having wavelengths in the 700-800 nm range). The absorption for the planar solar cell (sample 804) drops by approximately 50% as the wavelength of the light increases from approximately 650 nm to approximately 700 nm. The absorption of the nanodome solar cell (sample 802), however, remains above 90% over the same wavelength range. On a relative basis, therefore, the nanodome solar cell shows an improvement of approximately 80% over its planar counterpart.

Improved Light Trapping in Nanodome Solar Cells

It is yet another aspect of the present invention that the nanodome structure more effectively traps light once it has been coupled into optically active layer 110. As a result, solar cells in accordance with the present invention exhibit increased light absorption. Optically active layer 110 more effectively traps light due to the fact that it behaves much like a waveguide core cladded by bottom electrode 108 and air.

In some embodiments, bottom electrode 108, optically active layer 110, and top electrode 112 collectively define a nano-structured plasmonic waveguide. Light in optically active layer 110 is maintained in guided modes by bottom electrode 108 and top electrode 112.

Figure 9:
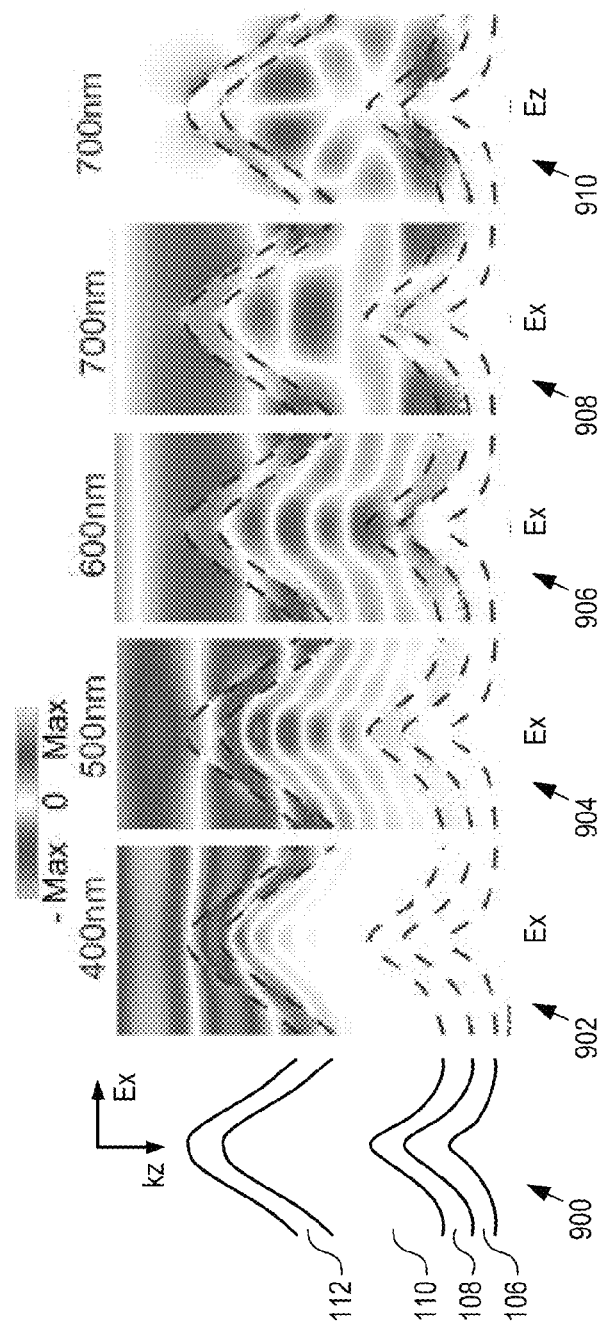
FIG. 9 depicts simulations of the waveguiding characteristics of solar cell 100 for a plurality of wavelengths.

FIG. 9 depicts simulations of the waveguiding characteristics of solar cell 100 for a plurality of wavelengths. Plots 902-910 depict solutions of Maxwell equations with the three-dimensional finite-different time-domain simulation for light at wavelengths of 400, 500, 600, and 700 nm Structure 900 is a simplified schematic diagram depicting the cross-sectional layer structure of one nanodome of solar cell 100, with incident plane waves polarized in x direction. The periodicity of the nanodome array is 450 nm in both the x- and y-dimensions. The dielectric constants of silver and silicon are taken from tabulated experimental data modeled by complex-conjugate pole-residue method. The simulated nanodome structure absorbs approximately 93% of normally incident sunlight for the spectral range from 400 nm to 800 nm, as depicted in FIG. 8B. These results match well with the experimental data provided in FIGS. 8A and 8C.

Plots 902 and 904 depict simulations of the x-component of the electric field of light having wavelengths of 400 and 500 nm, respectively, in a nanodome of solar cell 100. As can be seen from the simulations, short wavelength light (<~500 nm) is absorbed almost completely in the a-Si:H silicon material of optically active layer 110. In fact, with an efficient anti-reflection layer, nearly all incident light having these wavelengths is absorbed in a single path through the layer.

Plots 906 and 908 depict simulations of the x-component of the electric field of light having wavelengths of 600 and 700 nm, respectively, in the nanodome. These simulations clearly show that as the wavelength of light increases, guided modes begin to appear within optically active layer 110. These guided modes appear as a result of the guiding influence of the top and bottom electrodes and the nanodome shape of solar cell 100.

Plot 910 depicts simulation results for the z-component of the electric field of light having a wavelength of 700 nm within the nanodome. This simulation demonstrates that strong guided modes are confined inside the nanodome structure.

The ability to develop guided modes in optically active layer 110 is of particular import in the longer wavelength regimes (plots 906-910), since the absorptivity of the optically active layer material is lower for these wavelengths. As a result, longer wavelength light is not readily absorbed during a single trip through the deposited thickness of the layer.

One skilled in the art will recognize, after reading this Specification, that the dispersion relation of the guided modes depicted in plots 902-910 can be strongly influenced by the presence of plasmonic response of underlying silver-based back-reflector 104.

Figure 10:
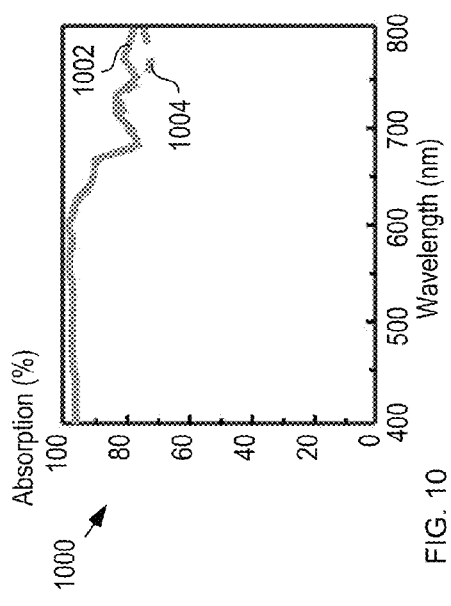
FIG. 10 depicts absorption spectra for a nanodome solar cell, including and excluding loss due to metal in a back-reflector.

FIG. 10 depicts absorption spectra for a nanodome solar cell, including and excluding loss due to metal in a back-reflector. Absorption spectra 1000 is that of a nanodome solar cell that is analogous to solar cell 100, including metallic loss from back-reflector 106. Absorption spectra 1002 is that of a nanodome solar cell that is analogous to solar cell 100, excluding metallic loss from back-reflector 106. In the lossless case, the weighted absorption for normal incident sun light is approximately 92% as compared to approximately 93% for realistic metallic-loss case. Therefore, it can be inferred that metallic loss contributes only about 1% of absorption.

Returning now to FIG. 8A, the data for samples 804 and 806 exhibit significant interference oscillations at wavelengths greater than approximately 550 nm for flat film devices. These interference oscillations arise due to Fabry-Perot interference, since long wavelength light in not completely absorbed in the optically active layer of the device. As a result, this light is reflected by the back-reflector and escapes the optically active layer to interfere with light reflected from the top layer of the device. For flat devices without an anti-reflection layer, this interference causes a significant absorption valley around wavelengths of approximately 570 nm, 640 nm and 750 nm. For example, approximately 80% of light escaped at the wavelength of 640 nm. While adding an anti-reflection layer reduces the reflection loss, it also shifts the absorption valleys to shorter wavelengths, consistent with the light interference theory.

The data for nanodome samples 802 and 808, however, exhibit relatively flat broad band absorption. The interference oscillation from nanodome solar cells is greatly reduced from the planar solar cell case, suggesting that very little light escapes from the reflection by back-reflector 106. This further suggests that nanodome solar cells exhibit significantly enhanced light trapping effects.

The enhanced light trapping enables significant improvement for nanodome solar cells versus planar cells in the wavelength range of 700-800 nm. In the illustrative embodiment, optically active layer 110 comprises anhydrous amorphous silicon, which has a bandgap wavelength of ~710 nm and a long band tail. For wavelengths greater than approximately 700 nm, absorptivity in optically active layer 110 drops quickly. This can be seen from the data for sample 806, where the absorption in the planar solar cell having an anti-reflection layer drops below 50%. In contrast, the data for sample 802 shows that the nanodome device with an anti-reflection layer can maintain absorption at ~90% over this wavelength range. The relative improvement for the nanodome solar cell compared to the planar solar cell is ~80%. The data suggests that nanodome solar cells can enhance light trapping significantly enough to enable significant absorption of photons having energy below the electrical bandgap of the optically active layer.

Improved Absorption Over an Increased Range of Incidence Angle

In a practical environment, received sunlight can be quite diffuse. It is another aspect of the present invention, therefore, that the nanodome structure increases the acceptance angle of a nanodome solar cell, which enables a nanodome solar cell to absorb light that is incident on it over a wide range of incident angles. As a result, nanodome solar cells can have higher efficiency than conventional planar solar cells.

Figure 11B:
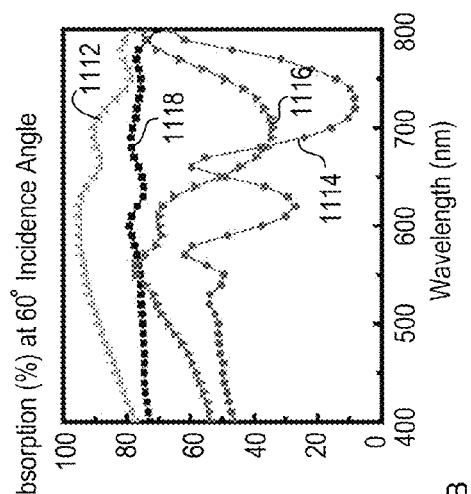
FIGS. 11A and 11B depict plots of absorption versus wavelength for solar cell samples 802, 804, 806, and 808 at angles of incidence of 30° and 60°, respectively.
Figure 11A:
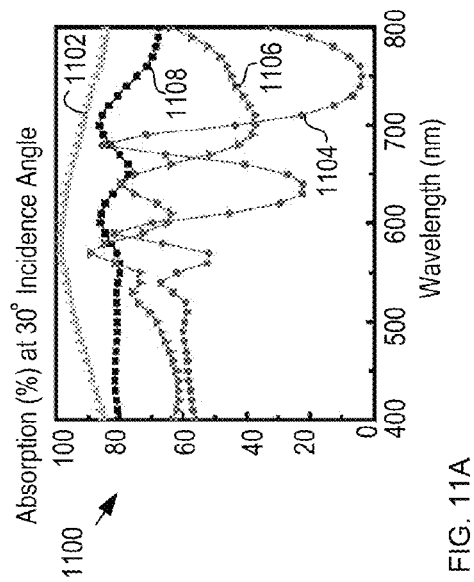

FIGS. 11A and 11B depict plots of absorption versus wavelength for solar cell samples 802, 804, 806, and 808 at angles of incidence of 30° and 60°, respectively. In plot 1100, data curves 1102, 1104, 1106, and 1108 correspond to samples 802, 804, 806, and 808, respectively. In similar fashion, in plot 1110, data curves 1112, 1114, 1116, and 1118 correspond to samples 802, 804, 806, and 808, respectively. The data in plots 1100 and 1110 show that absorption in the nanodome devices decreases by only 5% as the incident angle increases to 60°. In contrast, absorption in the planar devices decreases by approximately 13% over the same angular range. Nanodome solar cells, therefore, offer significantly better performance over that of planar solar cells in a practical environment.

FIGS. 12A and 12B depict photographs of nanodome solar cells and conventional planar solar cells, respectively. The photographs in FIGS. 12A and 12B illustrate the performance advantage of a nanodome solar cell in diffuse light conditions. Each solar cell is without an anti-reflection layer, and the photographs were taken in diffuse light conditions. Planar device 1202 is significantly more reflective than nanodome device 1200. Further, under this illumination planar device 1202 has a reddish appearance due to inefficient absorption at wavelengths in the 700-800 nm spectral range. Nanodome device 1200, on the other hand, is less reflective and looks black due to its efficient light absorption and light trapping across the entire 400-800 nm spectral range.

The combination of improved trapping and absorption, as well as lower reflectivity results in nanodome solar cells that have very high efficiency as compared to prior-art solar cells. This conclusion is supported by results from experimentation, wherein nanodome solar cells and conventional planar solar cells were illuminated in a solar simulator at 1 sun AM1.5G illumination. The nanodome solar cells exhibited power-conversion efficiencies that are 25% higher than those of the planar solar cells.

FIGS. 13A and 13B depict plots of the electrical response of a nanodome solar cell and a planar solar cell, respectively. Plot 1300 includes data curves 1302 and 1304 which show I-V curves for a nanodome device taken under zero illumination and under 1 sun AM1.5G illumination, respectively. Plot 1306 includes data curves 1308 and 1310 which show I-V curves for a planar device taken under zero illumination and under 1 sun AM1.5G illumination, respectively.

The data shown in plot 1300 show a power efficiency of 5.9% (open circuit voltage, Voc=0.75 V; short circuit current, Jsc=17.5 mA/cm2; fill factor, FF=0.45) for the nanodome solar cell. The data shown in plot 1306, on the other hand, show a power efficiency of just 4.7% (Voc=0.76V, Jsc=11.4 mA/cm2, FF=0.54) for the planar solar cell. The significant improvement of power efficiency come from a large short-circuit current of nanodome devices (17.5 mA/cm2), which is higher than even that reported for a world record single junction a-Si:H solar cell (15.6 mA/cm$^2$). Further, the nanodome solar cell exhibits initial power efficiency of approximately 10.6%, which is only slightly lower than the theoretical limit dictated by the a-Si:H band gap (20.5 mA/cm$^2$).

In a practical environment, collection of dust particles on the surface of an optical semiconductor device will degrade its efficiency over time. In some embodiments, surface 114 comprises a modification that provides the solar cell with a self-cleaning capability. One skilled in the art will recognize that such surface modification is suitable for use with many other embodiments of the present invention as well.

Returning now to FIGS. 1 through 3E, at optional operation 206, surface 114 is modified with hydrophobicity-inducing molecules, such as perfluorooctyl trichlorosilane (PFOS) molecules. Such modification of surface 114 provides a hydrophobicity that can approach or achieve superhydrophobicity.

Figure 14C:
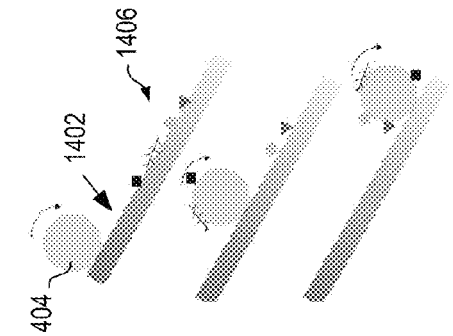
FIG. 14C depicts a representation of a process for cleaning a surface having self-cleaning capability.
Figure 14B:
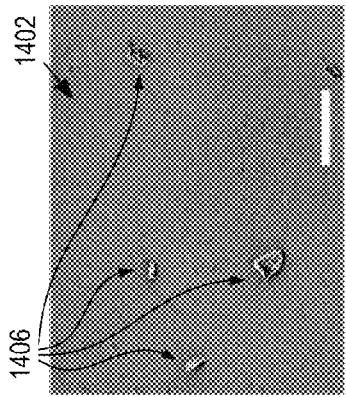
FIG. 14B depicts a photograph of surface 1402 after exposure to a debris-filled environment.
Figure 14A:
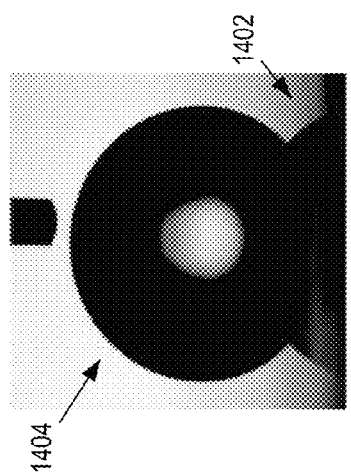
FIG. 14A depicts a water droplet disposed on a nanodome solar surface that has been modified with hydrophobicity-inducing molecules.

FIG. 14A depicts a water droplet disposed on a nanodome solar surface that has been modified with hydrophobicity-inducing molecules. Surface 1402 is analogous to surface 114, wherein surface 1402 has been modified to with hydrophobicity-inducing molecules such that surface 1402 approaches superhydrophobicity. A surface having super hydrophobicity is defined as a surface having a water-contact angle greater than 150°. Superhydrophobicity enables self-cleaning of surface 114. The nanoscale roughness of surface 114 is required to attain a surface that is superhydrophobic. While superhydrophobicity is preferred, a water-contact angle of greater than 140° is sufficient for enabling surface 114 to be self-cleaning. The water-contact angle of surface 1402 is approximately 141° (+2°).

FIG. 14B depicts a photograph of surface 1402 after exposure to a debris-filled environment. In the photograph, debris 1406 is disposed on surface 1402.

FIG. 14C depicts a representation of a process for cleaning a surface having self-cleaning capability. Surface 1402 is cleaned simply by enabling the movement of one or more water droplets 1404 across it so that the water droplets capture debris 1406 and remove it from surface 1402.

Figure 14E:
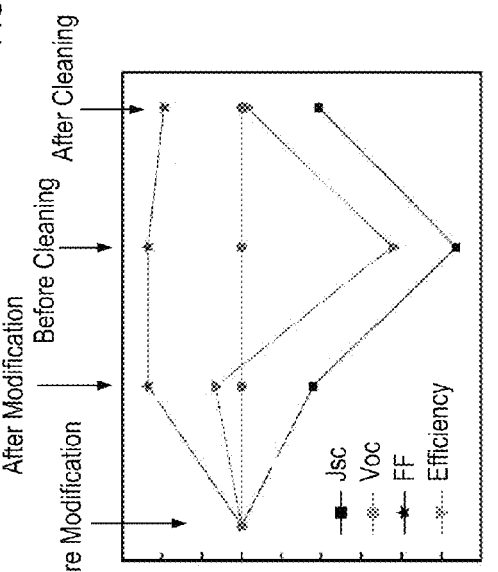
FIG. 14E depicts normalized device performance of a nanodome solar cell before and after a self-cleaning procedure.
Figure 14D:
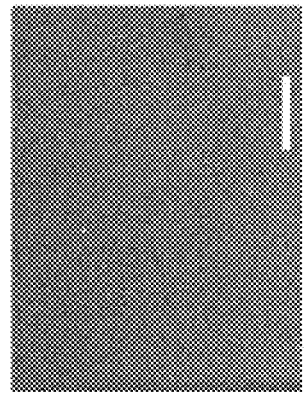
FIG. 14D depicts surface 1402 after a self-cleaning process.

FIG. 14D depicts surface 1402 after it has undergone a self-cleaning process. As evident from the photograph, all debris 1406 has been removed from surface 1402.

FIG. 14E depicts normalized device performance of a nanodome solar cell before and after a self-cleaning procedure. Prior to surface modification, all device parameters (i.e., open circuit voltage, Voc; short circuit current, Jsc; fill factor, FF; and efficiency) are normalized to a single point on plot 1408.

After surface modification, a change in fill factor and short-circuit current is noted (although unexplained). Efficiency, however, remains fairly constant.

After a build-up of debris 1406 on surface 1402, efficiency and short-circuit current each drop significantly, as expected.

Upon completion of the self-cleaning procedure, both efficiency and short-circuit current return to their post-modification levels, thereby demonstrating that modification of surface 1402 is effective in enabling self-cleaning of the solar cell.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An article comprising:
   a substrate comprising a first plurality of surface features that is arranged in a first arrangement that is periodic in two dimensions, wherein the periodicity in at least one dimension is based on a wavelength of light within a spectral range of interest;
   a first composite layer disposed on the substrate, the first composite layer comprising a plurality of domes that is arranged in the first arrangement, wherein the first composite layer is an optically active layer that is characterized by a first band-gap wavelength, $\lambda_{bg1}$; and
   a first layer that is substantially reflective for light having a wavelength within the range of approximately 400 nm to approximately 1600 nm, the first layer being between the substrate and the first composite layer, and the first layer comprising a second plurality of surface features that is arranged in the first arrangement, wherein the second plurality of surface features is operative for enhancing light-absorption in the first composite layer.

2. The article of claim 1 wherein the first arrangement is a close-packed arrangement.

3. The article of claim 1 wherein the first arrangement has a first periodicity that is greater than $2\lambda_{bg1}$.

4. The article of claim 1 further comprising a second layer that is substantially conformal with the first composite layer, wherein the second layer comprises a first material that has a refractive index that is lower than the refractive index of the first composite layer, and wherein the first composite layer interposes the substrate and the second layer, and further wherein second layer and first composite layer collectively have a lower reflectivity than the first composite layer for light having a wavelength within the range of approximately 400 nm to approximately 1600 nm.

5. The article of claim 1 further comprising a second layer that is substantially conformal with the first composite layer, wherein the second layer comprises a first material that has a refractive index that is lower than the refractive index of the first composite layer, and wherein the first composite layer interposes the substrate and the second layer, and further wherein second layer and first composite layer collectively have a lower reflectivity than the first composite layer for light having a wavelength within the range of approximately 400 nm to approximately 800 nm.

6. The article of claim 5 wherein the second layer has an effective graded refractive index profile.

7. The article of claim 1 wherein the first composite layer and the first layer collectively define a photonic waveguide.

8. The article of claim 1 further comprising a second layer that is substantially conformal with the first composite layer, wherein the second layer comprises a first material that has a refractive index that is lower than the refractive index of the first composite layer;
wherein the first composite layer interposes the first layer and the second layer; and
wherein first composite layer, first layer, and second layer collectively define a photonic waveguide.

9. The article of claim 1 wherein the first composite layer comprises a solar cell layer structure.

10. The article of claim 9 wherein the solar cell layer structure comprises p-doped hydrogenated amorphous silicon disposed on substantially intrinsic hydrogenated amorphous silicon disposed on n-doped hydrogenated amorphous silicon.

11. The article of claim 1 wherein the first composite layer has a thickness within the range of approximately 50 nm to approximately 5000 nm.

12. The article of claim 11 wherein the first composite layer has a thickness within the range of approximately 200 nm to approximately 500 nm.

13. The article of claim 1 further comprising a second composite layer comprising a plurality of domes, wherein the second composite layer is an optically active layer that is characterized by the first band gap wavelength, $\lambda_{bg1}$, and wherein the second composite layer is disposed on the first composite layer, and further wherein each of the first composite layer and second composite layer comprises a solar cell layer structure.

14. The article of claim 1 further comprising a second composite layer comprising a plurality of domes, wherein the second composite layer is an optically active layer that is characterized by a second band gap wavelength, $\lambda_{bg2}$, and wherein the second composite layer is disposed on the first composite layer, and further wherein each of the first composite layer and second composite layer comprises a solar cell layer structure.

15. The article of claim 1 further comprising a surface that is characterized by a water-contact angle that is greater than or equal to 140°.

16. A method comprising:
providing a substrate having an array of projections that is arranged in a first arrangement that is periodic in two dimensions;
forming a first layer on the substrate such that the first layer includes a plurality of surface features that are arranged in the first arrangement, wherein the first layer is substantially reflective for light having a wavelength within the range of approximately 400 nm to approximately 1600 nm; and
forming a first composite layer disposed on the first layer, wherein the first composite layer comprises a plurality of domes, each of the plurality of domes being formed on a different one of the array of projections, and
wherein the first composite layer is an optically active layer this is characterized by a first band gap wavelength, $\lambda_{bg1}$.

17. The method of claim 16 wherein the substrate is provided such that the array of projections has a first periodicity that is less than or equal to $\lambda_{bg1}$.

18. The method of claim 16 wherein the substrate is provided by operations comprising:
forming a mask on the substrate, wherein mask comprises a first material that has a first etch rate in an etchant, and wherein the substrate comprises a second material that has a second etch rate in the etchant, and further wherein the second etch rate is greater than the first etch rate; and
etching the mask and substrate in the etchant.

19. The method of claim 18 wherein the mask is formed by disposing a monolayer of particles of the first material on a surface of the substrate.

20. The method of claim 16 wherein the first composite layer is formed by conformally depositing at least one semiconductor layer on the substrate such that each dome of the plurality of domes is formed on a different projection of the array of projections.

21. The method of claim 16 wherein the first layer is formed such that it is substantially reflective for light having a wavelength within the range of approximately 400 nm to approximately 800 nm.

22. The method of claim 16 wherein the first layer is formed such that it comprises a surface modulation that induces enhanced light absorption in the first composite layer.

23. The method of claim 16 wherein the first layer is formed such that it comprises a photonic waveguide for receiving and scattering light that has transited the first composite layer.

24. The method of claim 16 further comprising forming a second layer that is substantially conformal with the first composite layer, wherein the first composite layer interposes the second layer and the substrate, and wherein the second layer comprises a first material that has a refractive index that is lower than the refractive index of the first composite layer, and further wherein the second layer and first composite layer collectively have a lower reflectivity than the first composite layer for light having a wavelength within the range of approximately 400 nm to approximately 800 nm.

25. The method of claim 16 further comprising:
forming a second layer that is substantially conformal with the first composite layer, wherein the first composite layer interposes the second layer and the substrates, and wherein the second layer is electrically conductive;
forming a second composite layer that is substantially conformal with the second layer, wherein second layer interposes the first composite layer and the second composite layer, and wherein the second composite layer plurality of domes, and wherein the second composite layer is an optically active layer this is characterized by the first band gap wavelength, $\lambda_{bg1}$.

26. The method of claim 16 further comprising:
forming a second layer that is substantially conformal with the first composite layer, wherein the first composite layer interposes the second layer and the substrates, and wherein the second layer is electrically conductive;
forming a second composite layer that is substantially conformal with the second layer, wherein second layer interposes the first composite layer and the second composite layer, and wherein the second composite layer plurality of domes, and wherein the second composite layer is an optically active layer this is characterized by a second band gap wavelength, $\lambda_{bg2}$.

27. The method of claim 16 further comprising forming a second layer, wherein the first composite layer interposes the second layer and a substrate, and wherein the second layer comprises a surface that is characterized by a water-contact angle that is greater than or equal to 140°.

28. The method of claim 16 wherein the first composite layer is formed by conformally depositing a plurality of semiconductor layers, wherein the plurality of semiconductor layers collectively define a solar cell layer structure.

29. The method of claim 16 wherein the first composite layer is formed by operations comprising:
   conformally depositing a first semiconductor layer, wherein the first semiconductor layer comprises n-doped hydrogenated amorphous silicon;
   conformally depositing a second layer of semiconductor on the first semiconductor layer, wherein the first composite layer of semiconductor comprises substantially intrinsic hydrogenated amorphous silicon; and
   conformally depositing a third layer of semiconductor on the second semiconductor layer, wherein the third layer of semiconductor comprises p-doped hydrogenated amorphous silicon.

30. The method of claim 16 wherein the first composite layer is formed by conformally depositing a plurality of semiconductor layers, wherein the plurality of semiconductor layers collectively define a light-emitting diode layer structure.

31. The method of claim 16 wherein the first composite layer is formed by conformally depositing a plurality of semiconductor layers, wherein the plurality of semiconductor layers collectively define a photodetector layer structure.

32. The method of claim 16 wherein the first composite layer is formed by conformally depositing a plurality of semiconductor layers, wherein the plurality of semiconductor layers collectively define an optical modulator layer structure.

* * * * *